United States Patent
Kiyokawa (10) Patent No.: US 11,445,154 B2
(45) Date of Patent: Sep. 13, 2022

(54) LASER DRIVE APPARATUS FOR SEMICONDUCTOR LASER FOR VIDEO DISPLAY APPARATUS

(71) Applicant: Nisshinbo Micro Devices Inc., Tokyo (JP)

(72) Inventor: Masaki Kiyokawa, Sakai (JP)

(73) Assignee: Nisshinbo Micro Devices Inc., Tokyo (JP)

( * ) Notice: Subject to any disclaimer, the term of this patent is extended or adjusted under 35 U.S.C. 154(b) by 0 days.

(21) Appl. No.: 17/281,451

(22) PCT Filed: Dec. 21, 2018

(86) PCT No.: PCT/JP2018/047247
§ 371 (c)(1),
(2) Date: Mar. 30, 2021

(87) PCT Pub. No.: WO2020/129238
PCT Pub. Date: Jun. 25, 2020

(65) Prior Publication Data
US 2022/0006985 A1     Jan. 6, 2022

(51) Int. Cl.
*H04N 9/31*     (2006.01)

(52) U.S. Cl.
CPC ............................... *H04N 9/3135* (2013.01)

(58) Field of Classification Search
CPC ................................................... H04N 9/3135
USPC ........ 345/204; 372/297; 341/144; 315/38.07
See application file for complete search history.

(56) References Cited

U.S. PATENT DOCUMENTS

| | | | | |
|---|---|---|---|---|
| 4,573,005 A | * | 2/1986 | van de Plassche | G05F 3/265 341/135 |
| 4,683,458 A | * | 7/1987 | Hallgren | H03M 1/0682 341/154 |
| 5,966,395 A | * | 10/1999 | Ikeda | H01S 5/06832 372/38.07 |

(Continued)

FOREIGN PATENT DOCUMENTS

| | | |
|---|---|---|
| JP | 8-18132 A | 1/1996 |
| JP | 2002-261381 A | 9/2002 |

(Continued)

OTHER PUBLICATIONS

International Search Report in connection with PCT/JP2018/047247.

*Primary Examiner* — Prabodh M Dharia
(74) *Attorney, Agent, or Firm* — Paul Teng (57) ABSTRACT

A laser drive apparatus is provided with a digital to analog converter including current sources of a number corresponding to a bit number of a digital input code and switches of a number corresponding to the number of bits. The digital input code is converted from input video data, and provided to a DA converter, that generates RGB drive currents for a laser scanning type image display apparatus driven by the laser drive apparatus, and output currents from current sources are weighted in accordance with bits of the digital input code. A ratio of each of the output currents from each of the current sources to a load capacity of a driver having each of current mirror circuits is identical for all bits corresponding to each of the current sources, and the current mirror circuits is configured to distribute load capacity of the driver circuit.

6 Claims, 5 Drawing Sheets

(56) References Cited

U.S. PATENT DOCUMENTS

| | | | | |
|---|---|---|---|---|
| 9,136,866 B2* | 9/2015 | Downey | ............... | H03M 1/785 |
| 2005/0002429 A1* | 1/2005 | Nakatani | ................. | H01S 5/042 |
| | | | | 372/38.07 |
| 2009/0262769 A1* | 10/2009 | Bergmann | ............. | G11B 7/127 |
| | | | | 341/144 |
| 2012/0133300 A1* | 5/2012 | Bazzani | ................. | H05B 47/10 |
| | | | | 315/297 |

FOREIGN PATENT DOCUMENTS

| JP | 2005-26410 A | 1/2005 |
|---|---|---|
| JP | 3880914 B2 | 11/2006 |
| JP | 2010-66303 A | 3/2010 |

* cited by examiner

LASER DRIVE APPARATUS FOR SEMICONDUCTOR LASER FOR VIDEO DISPLAY APPARATUS

TECHNICAL FIELD

The present invention relates to a laser drive apparatus for a semiconductor laser for an image display apparatus such as a head-up display (HUD), and an image display apparatus including the laser drive apparatus.

BACKGROUND ART

For example, an image display apparatus of a laser scanning system using a semiconductor laser, such as a head-up display (HUD), uses video data as a video signal in order to express brightness of each of RGB colors. The video data controlled for each dot is converted into a current by the laser drive apparatus, and the laser is driven to obtain a predetermined amount of light. In addition, a predetermined color can be expressed by superimposing an amount of light of the RGB laser. This laser drive system is called a power modulation system.

The resolution of the image display apparatus depends on a cycle of MEMS and a data rate of an image, and is restricted by a dot cycle due to responsiveness of the laser drive apparatus. Thus, a laser drive apparatus capable of high-speed drive is required to increase the resolution of the image display apparatus. The image display apparatus of laser scanning system uses video data as a video signal in order to express the brightness of each of RGB colors. The video data is converted into a current by a laser drive apparatus to drive the laser. The resolution of the image display apparatus is restricted by the responsiveness of the laser drive apparatus. Therefore, a laser drive apparatus capable of high-speed driving is required to increase the resolution.

PRIOR ART DOCUMENT

Patent Document

[Patent Document 1] Japanese Patent No. JP3880914B2.

SUMMARY OF THE INVENTION

Problems to be Solved by the Invention

However, a conventional laser drive apparatus is configured to include a digital to analog converter (hereinafter, referred to as a DA converter) that has a bit number corresponding to video data and converts the video data into a current, and a driver that amplifies an output current of the DA converter with a current mirror circuit and outputs the amplified output current. In this case, the DA converter of current output type used in the laser drive apparatus often has such a configuration that the output of the DA converter is turned back by the current mirror circuit in order to improve area efficiency.

While an output response of the driver is determined by the time required to charge a gate load capacity of the current mirror circuit, the output current of the DA converter of a gate charging current changes depending on the video data. This causes the following problems:

(1) the responsiveness of the laser drive apparatus depends on the video data, which makes color matching difficult, and this results in unclear images; and (2) when the video data is small, the responsiveness decreases significantly, which becomes a bottleneck in supporting high resolution.

An object of the present invention is to provide a laser drive apparatus capable of solving the above problems and improving responsiveness of the laser drive apparatus as compared with the prior art, and an image display apparatus using the laser drive apparatus.

Means for Solving the Problems

According to a first aspect of the present invention, there is provided a laser drive apparatus including a digital to analog converter including a plurality of current sources of a number corresponding to a bit number of a digital input code and a plurality of switches of a number corresponding to the number of bits. The plurality of switches is connected to the plurality of current sources and selectively switching over presence or absence of output of a control current from each of the plurality of current sources. The digital to analog converter outputs control currents corresponding to the digital input code as output respective currents from the plurality of switches. The laser drive apparatus include a driver circuit including a plurality of current mirror circuits that generate a drive current corresponding to each of the output currents based on each of the output currents to drive a laser diode. The driver circuit includes the plurality of current mirror circuits, in which the plurality of current sources is divided into a plurality of current source sets, the plurality of current mirror circuits is connected to the plurality of current source sets via the plurality of switches, and generates a drive current corresponding to each of the output currents from the plurality of current source sets to drive the laser diode. The plurality of current mirror circuits is configured to distribute load capacity of the driver circuit.

According to a second aspect of the present invention, there is provided an image display apparatus including the laser drive apparatus.

Effect of the Invention

Therefore, in the present invention, the load of the driver is distributed and, thus, by configuring the response speed of the laser drive apparatus to be constant without depending on the brightness (video data), color matching can be facilitated and a clear image can be obtained. In addition, it is possible to support high resolution by increasing the responsiveness in the case of small video data which is a bottleneck of the responsiveness.

MODES FOR CARRYING OUT THE INVENTION

Hereinafter, embodiments according to the present invention will be described with reference to the drawings. The same or similar components are designated by the same reference characters.

Laser Drive Apparatus

Figure 1:
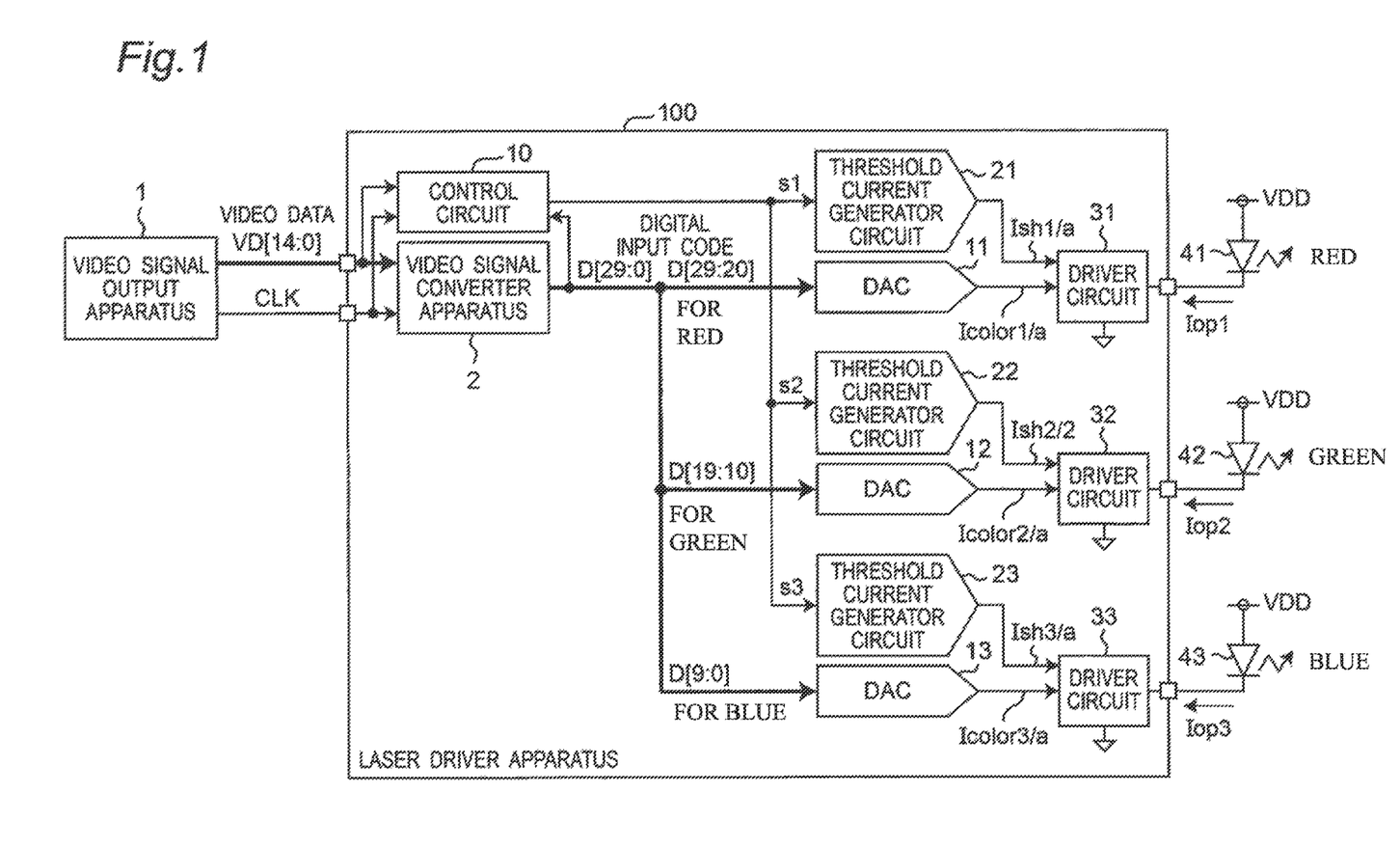
FIG. 1 is a schematic block diagram of a configuration example of an image display apparatus including a laser drive apparatus according to an embodiment and a comparison example.
Figure 2:
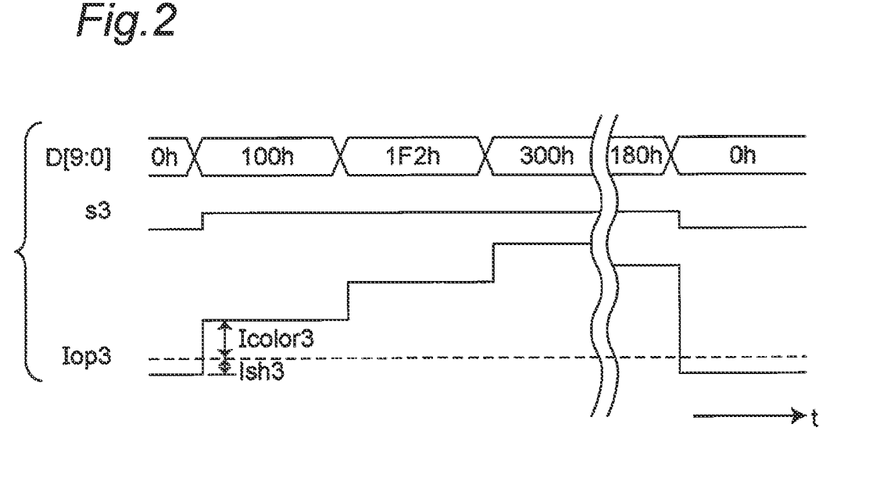
FIG. 2 is a timing chart of an operation of the laser drive apparatus of FIG. 1.

FIG. 1 is a schematic block diagram of a configuration example of an image display apparatus including a laser drive apparatus 100 for an image display apparatus such as a head-up display (HUD) according to an embodiment and a comparison example, and FIG. 2 is a timing chart of an operation of the laser drive apparatus of FIG. 1.

Referring to FIG. 1, the laser drive apparatus 100 is configured to include a control circuit 10, a video signal converter apparatus (video data interface) 2, current-steering DA converters (DAC) 11, 12, and 13, and threshold current generator circuits 21, 22, and 23, and driver circuits 31, 32, and 33. The laser drive apparatus 100 inputs video data VD inputted from a video signal output apparatus (video processor and controller) 1 in synchronization with a clock signal CLK, generates three drive currents, and drives laser diodes 41, 42, and 43 to allow the corresponding laser diodes 41, 42, and 43 to emit light. In this case, the laser diodes 41, 42, and 43 emit, for example, red, green, and blue lights, respectively.

A video signal converter apparatus 2 inputs, for example, 15-bit video data VD [14:0] in synchronization with the clock signal CLK, and then inputs the video data VD [14:0] to a total of 30 bits of digital input code [29:00] for RGB. Next, the video signal converter apparatus 2 outputs a 10-bit digital input code D [29:20] for red to a DA converter 11, outputs a 10-bit digital input code D [19:10] for green to the DA converter 11 and outputs a 10-bit digital input code D [9:0] for blue to the DA converter 11. In this case, [X:Y] indicates digital data of a bit number (X+Y) from bit Y to bit X.

Based on the video data VD [14:0], the clock signal CLK, and the digital input code D [29:00], the control circuit 10 generates, for example, as shown in FIG. 2, a timing signal s1 indicating a drive timing for red, a timing signal s2 indicating a drive timing for green, and a timing signal s3 indicating a drive timing for blue, and outputs the timing signals to the threshold current generator circuits 21, 22 and 23, respectively. It is noted that the timing signals s1, s2, and s3 become an L level when each RGB value of the digital input code D [29:00] is 0, while they become an H level when each RGB value is one or more.

The threshold current generator circuit 21 generates a predetermined threshold current (hereinafter, referred to as a step-up auxiliary current for reliable light emission upon start of the light emission) Ish1/a (amplitude value Ish1/a) at the timing of the timing signal s1, and outputs the predetermined threshold current Ish1/a to the driver circuit 31. The threshold current generator circuit 22 generates a predetermined threshold current Ish2/a (amplitude value Ish2/a) at the timing of the timing signal s2 and outputs the predetermined threshold current Ish2/a to the driver circuit 32. The threshold current generator circuit 23 generates a predetermined threshold current Ish3/a (amplitude value Ish3/a) at the timing of the timing signal s3 and outputs the predetermined threshold current Ish3/a to the driver circuit 33. In this case, "a" is an amplification factor (constant) of the driver circuits 31, 32, and 33, which are described later.

The DA converter 11 DA-converts the input digital input code D [29:20] into an analog drive current Icolor1/a (amplitude value Icolor1/a), and outputs the analog drive current Icolor1/a to the driver circuit 31. The DA converter 12 DA-converts the input digital input code D [19:10] into an analog drive current Icolor2/a (amplitude value Icolor2/a), and outputs the analog drive current Icolor2/a to the driver circuit 32. The DA converter 13 DA-converts the input digital input code D [9:0] into an analog drive current Icolor3/a (amplitude value Icolor3/a), and outputs the analog drive current Icolor3/a to the driver circuit 33.

The driver circuit 31 drives the laser diode 41 using the drive current Icolor1/a, and a drive current Iop1 that is obtained by adding the threshold current Ish1/a and amplifying at an amplification factor "a". The driver circuit 32 drives the laser diode 42 using the drive current Icolor2/a, and a drive current Iop2 that is obtained by adding the threshold current Ish2/a and amplifying at the amplification factor "a". The driver circuit 33 drives the laser diode 43 using the drive current Icolor3/a, and a drive current Iop3 (see FIG. 2) that is obtained by adding the threshold current Ish3/a and amplifying at the amplification factor "a".

Comparison Example

Figure 3:
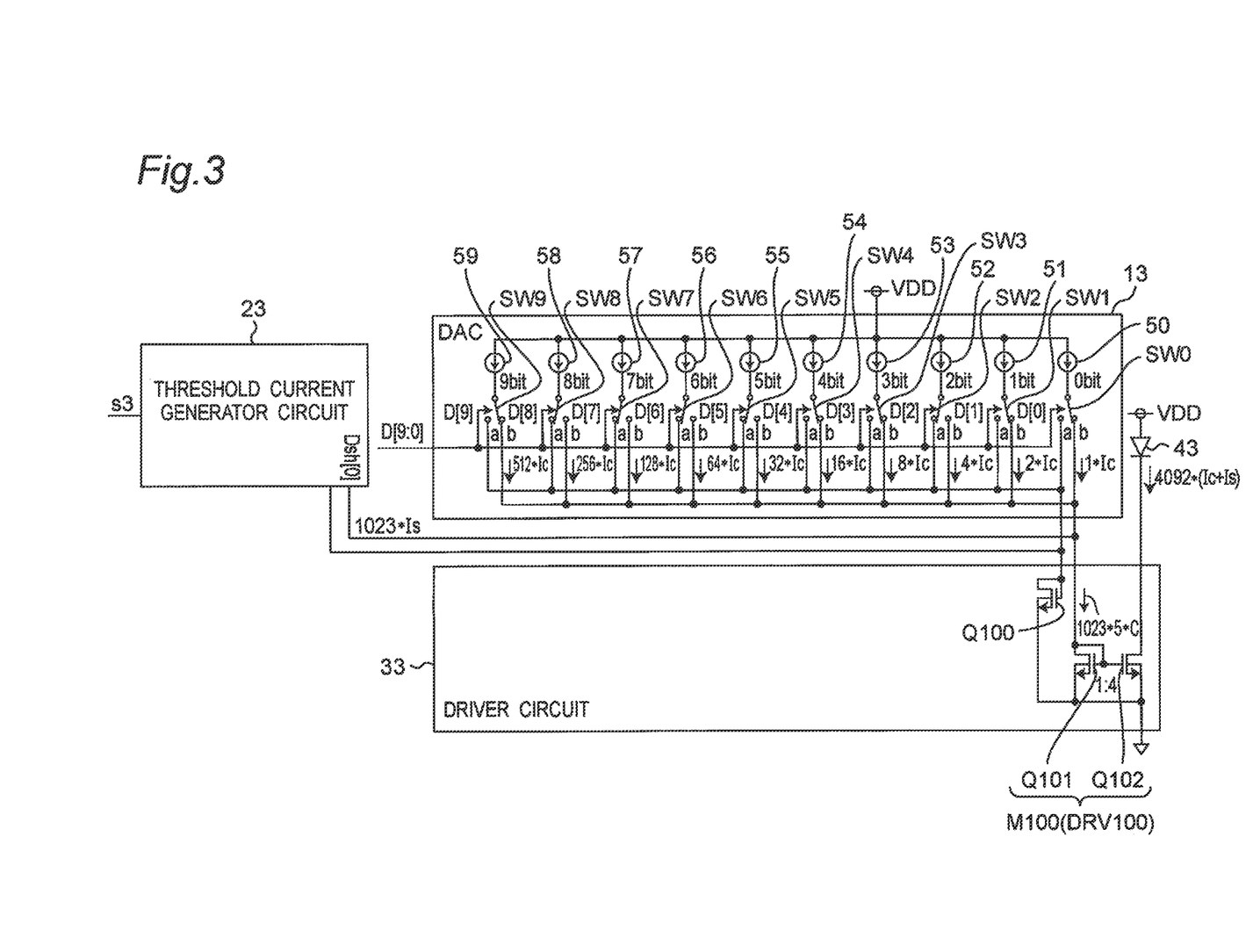
FIG. 3 is a circuit diagram of a configuration example of a threshold current generator circuit, a DA converter, and a driver circuit for the laser drive apparatus according to the comparison example.

FIG. 3 is a circuit diagram of a detailed configuration example of the threshold current generator circuit 23, the DA converter 13, and the driver circuit 33 for the laser drive apparatus according to the comparison example.

Referring to FIG. 3, the threshold current generator circuit 23 generates a predetermined threshold current Dsh [0] in response to the timing signal s3 and supplies the predetermined threshold current Dsh [0] to the driver circuit 33.

The DA converter 13 is configured to include ten current sources 50 to 59, and switches SW0 to SW9 configured to include, for example, a plurality of MOS transistors. Each of the switches SW0 to SW9 is switched over to a contact "a" when each value of the corresponding digital input code D [9:0] has the L level, while it is switched over to a contact "b" when each value has the H level. The driver circuit 33 is configured to include the following:

(1) a diode-connected MOS transistor Q100 connected to each of the current sources 50 to 59 when each of the switches SW0 to SW9 is switched over to the contact "a" and not allowing a drive current to flow; and (2) a current mirror circuit M100 of a driver DRV100, in which the current mirror circuit M100 is connected to each of the current sources 50 to 59 when each of the switches SW0 to SW9 is switched over to the contact "b" and allowing the drive current to flow.

In this case, the current mirror circuit M100 has a mirror ratio of 1:4, is configured to include a control-side MOS transistor Q101 and a load-side MOS transistor Q102, and controls the MOS transistors Q101 and Q102 such that the drive current being in proportion to the control current flowing through the control-side MOS transistor Q101 flows through the load-side MOS transistor Q102.

The above circuit of FIG. 3 describes the threshold current generator circuit 23, the DA converter 13, and the driver circuit 33 in relation to the light emission of the laser diode 43. The following components are configured are configured in a manner similar to the circuit of FIG. 3:

(1) the threshold current generator circuit 21, the DA converter 11, and the driver circuit 31 in relation to the light emission of the laser diode 41; and (2) the threshold current generator circuit 22, the DA converter 12, and driver circuit 32 in relation to the light emission of the laser diode 42.

Referring to FIG. 3, a basic output current from the DA converter 13 is Ic, a basic output current from the threshold current generator circuit 23 is Is, a basic load capacity of the driver is C, and * represents a multiplication symbol to indicate current values. The same applies to FIGS. 4 to 5.

In the circuit of FIG. 3 configured as above, the threshold current generator circuit generates a threshold current 1023*Is equal to an emission threshold of the laser diodes 41, 42, and 43 before being multiplied by the constant of "a" by the driver, and outputs the threshold current 1023*Is to the current mirror circuit M100. The DA converter 13 converts the input digital input code D [9:0] into a drive current corresponding to the digital input code D [9:0], and outputs the drive current to the current mirror circuit M100. Thus, the current mirror circuit M100 is controlled such that the drive current obtained by multiplying (drive current+ threshold current) by a constant of "a" (a=4 in FIG. 2) flows through the laser diode 43.

Although the diode-connected MOS transistor Q100 is used in the driver circuit 33, the present invention is not limited to this. The diode-connected MOS transistor Q100 may not be used, and it may be directly grounded.

The current sources 50 to 59 of each bit of the DA converter 13 are weighted bit by bit so as to output the drive current corresponding to the digital input code D [9:0]. Each MOS transistor of the driver DRV100 of the driver circuit 33 is set to a size corresponding to the maximum output current of the DA converter 13 at the time of the full code. Namely, each of the bit circuits of the DA converter 13 outputs a drive current m*Ic corresponding to a weighting coefficient m. In this case, the total load capacity of the driver circuit 33 is defined as 1023*5*C, and "*5" is determined by the capacity to the current ratio of the driver.

Table 1 shows an example of the DAC output current for each video data in the circuit of the comparison example of FIG. 3, the output current of the threshold current generator circuit, the current mirror ratio of the driver, and the ratio of the driver load capacity to the DAC output current.

responsiveness of the laser drive apparatus is good. However, as each value of the video data decreases, a ratio of a specific current to the load capacity decreases, and capacity charging time of the driver increases. This leads to that the time until the gate voltage of the driver circuit DRV100 (the gate voltage of the MOS transistors Q101 and Q102) stabilizes increases and the responsiveness of the current output of the laser drive apparatus 100 decreases. In addition, the capacity to the current ratio is 5 to 1 at the minimum and up to 44.6 to 1 at the maximum, and thus the responsiveness varies greatly.

As described above, in the configuration of the comparison example, the output current of the DA converter 13 changes depending on each value of the video data, whereas the driver load capacity is constant, and thus the responsiveness of the current output of the laser drive apparatus 100 depends on the video data.

First Embodiment

Figure 4:
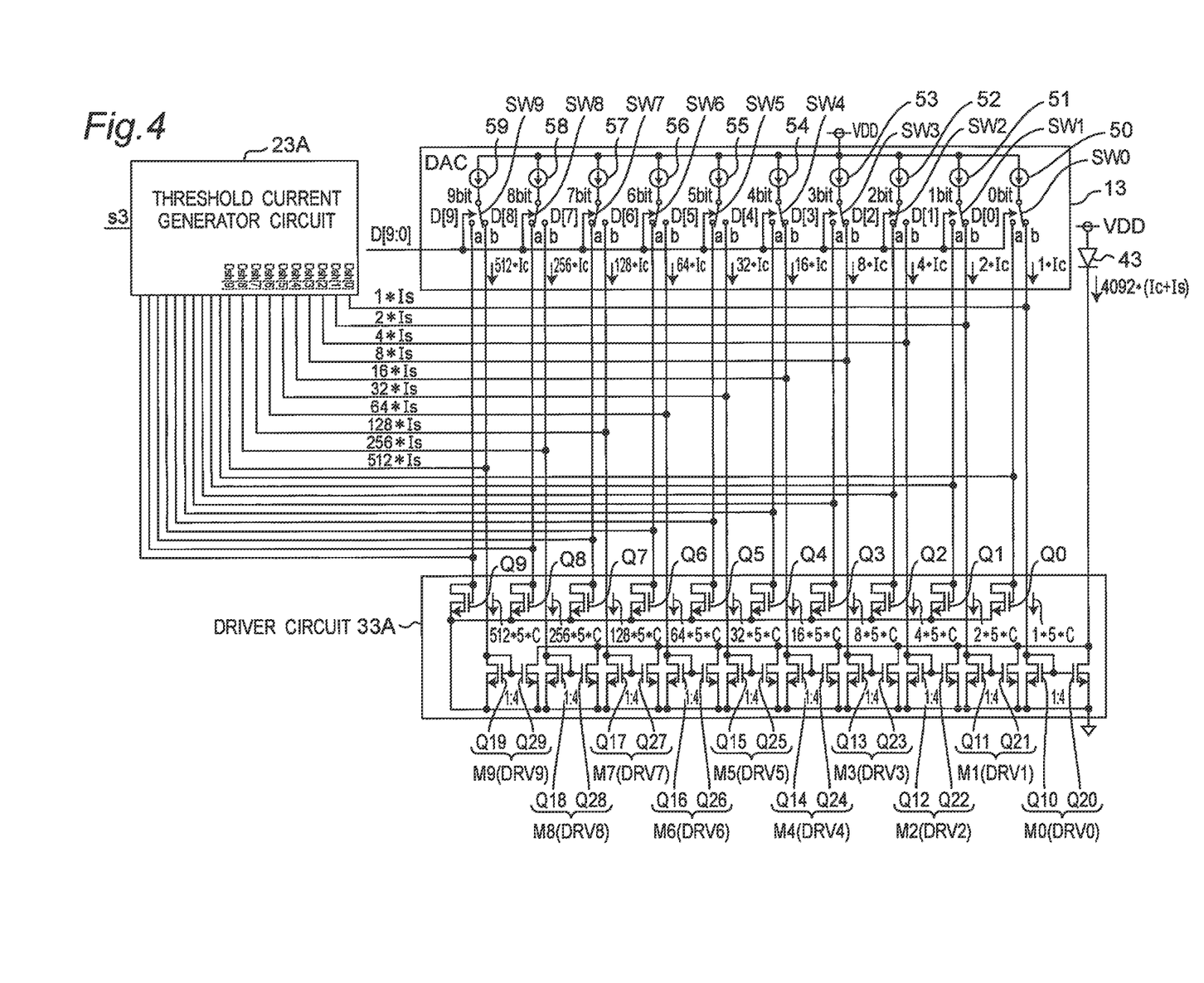
FIG. 4 is a circuit diagram of a configuration example of a threshold current generator circuit, a DA converter, and a driver circuit for a laser drive apparatus according to a first embodiment.

FIG. 4 is a circuit diagram of a configuration example of a threshold current generator circuit 23A, a DA converter 13, and a driver circuit 33A for a laser drive apparatus according to a first embodiment. The circuit of FIG. 4 differs from the circuit of FIG. 3 in the following points:

(1) the threshold current generator circuit 23A is provided in place of the threshold current generator circuit 23; and (2) the driver circuit 33A is provided in place of the driver circuit 33.

It is noted that the DA converter 13 has the same configuration as that of FIG. 3. The differences will be described below.

Referring to FIG. 4, the threshold current generator circuit 23A generates predetermined threshold currents Dsh [0] to Dsh [9] in response to the timing signal s3, and supplies the predetermined threshold currents Dsh [0] to Dsh [9] corresponding to the current sources 50 to 59, respectively, to the driver circuit 33A. In this case, the threshold current Dsh [n] (n=0, 1, 2, . . . , 9) is supplied to a control-side MOS transistor Q (10+n) of a driver DRVn described later.

The driver circuit 33A is configured to include:

(1) a diode-connected MOS transistor Q (10+n) connected to each current source (50+n) when each of the switches

TABLE 1

|  | | 9 bits | 8 bits | 7 bits | 6 bits | 5 bits | 4 bits | 3 bits | 2 bits | 1 bit | 0 bits |
| --- | --- | --- | --- | --- | --- | --- | --- | --- | --- | --- | --- |
| Item | Total | | | | | DRV100 | | | | | |
| Video data | 1023 | 512 | 256 | 126 | 64 | 32 | 16 | 8 | 4 | 2 | 1 |
| DAC output current | 1023*I | 160.8*I | 230.4*I | 115.2*I | 57.6*I | 28.8*I | 14.4*I | 7.2*I | 3.6*I | 1.8*I | 0.9*I |
| Threshold current | 1023*I | | | | | 102.3*I | | | | | |
| Driver mirror ratio | 1:4 | | | | | 1:4 | | | | | |
| Driver load capacity | 5115*C | | | | | 4604*C | | | | | |
| Driver output current | 7775*I | 2252.4*I | 1330.8*I | 870.0*I | 639.6*I | 524.4*I | 466.8*I | 438.0*I | 423.6*I | 416.4*I | 412.8*I |
| Capacity:Current | 5:1 | 8.2:1 | 13.8:1 | 21.2:1 | 28.8:1 | 35.1:1 | 39.4:1 | 42.0:1 | 43.5:1 | 44.2:1 | 44.6:1 |

In Table 1, calculations are performed where Ic=0.9*I and Is=0.1*I.

The output current Dsh [0] of the threshold current generator circuit 23 when each value of the video data is one or more is always turned on. The output current of the DA converter 13 increases or decreases in conjunction with each value of the video data, but the driver capacity value is constant. When each value of the video data is sufficiently large, the ratio of the current to the load capacity is smaller than when each value of the video data is small, and thus the SWn (n=0, 1, 2, . . . , 9) is switched over to the contact "a" and not allowing the drive current to flow; and (2) a current mirror circuit Mn of a driver DRVn, the current mirror circuit Mn being connected to each current source (50+n) when each of the switches SWn (n=0, 1, 2, . . . , 9) is switched over to the contact "b" and allowing the drive current to flow.

In this case, the current mirror circuits M0 to M9 have a mirror ratio of 1:4, is configured to include a control-side MOS transistor Q (10+n) and a load-side MOS transistor Q (20+n), and controls them such that the drive current being in proportion to the control current flowing through the control-side MOS transistor Q (10+n) flows through the corresponding load-side MOS transistor Q (20+n).

Thus, in the circuit of FIG. 4, each of the drivers DRV0 to DRV9 is provided corresponding to each of the current source 50 to 59, and the threshold current generator circuit 23A generates and outputs different threshold currents Dsh [0] to Dsh [9] corresponding to the current sources 50 to 59 (namely, each bit of the digital input code), respectively.

The above circuit of FIG. 4 describes the threshold current generator circuit 23A, the DA converter 13, and the driver circuit 33A in relation to the light emission of the laser diode 43. The following components are configured in a manner similar to the circuit of FIG. 4:

(1) the threshold current generator circuit 21A (not shown), the DA converter 11, and the driver circuit 31A (not shown) in relation to the light emission of the laser diode 41; and (2) the threshold current generator circuit 22A (not shown), the DA converter 12, and driver circuit 32A (not shown) in relation to the light emission of the laser diode 42.

In the circuit of FIG. 4 configured as above, the current sources 50 to 59 of each bit of the DA converter 13 are weighed bit by bit so as to output the current corresponding to each value of the digital input code D [9:0] as the video data. The output currents of the threshold current generator circuit 23A are divided such that the drive currents correspond to respective bits of the DA converter 13. In addition, the drivers DRV0 to DRV9 are divided and arranged so as to correspond to respective bits of the DA converter 13. In addition, respective output currents of the DA converter 13, the output current of the threshold current generator circuit 23A, and the input currents to the drivers DRV0 to DRV9 are merged and coupled with the same weighting.

In this case, when the digital input code of the video data is inputted as the full code, all the drivers DRV0 to DRV9 operate, and the total load capacity is the same as that of the driver circuit 33 of the comparison example of FIG. 3. The outputs of the drivers DRV0 to DRV9 are all bundled. Thus, each bit of the DA converter 13 outputs a drive current according to the weighting. The load capacity of the drivers DRV0 to DRV9 connected to the current sources 50 to 59 of each bit of the DAC 13 is (bits)*5*C, and the total load capacity of driver circuit 33A is 1023*5*C.

Table 2 shows an example of the DAC output current for each video data in the laser drive apparatus according to the first embodiment, the output current of the threshold current generator circuit, the current mirror ratio of the driver, and the ratio of the driver load capacity and the DAC output current.

In this case, calculations are performed where Ic=0.9*I and Is=0.1*I.

In the circuit of FIG. 4 configured as above, each respective currents of the threshold current generator circuit 23A when each value of the digital input code of the video data is one or more are always constant as shown in FIG. 4. Then, respective output currents of the DA converter 13 and the load capacity values of the drivers DRV0 to DRV9 increase or decrease in conjunction with the digital input code. The ratio of the output current of the threshold current generator circuit 23A when the video data is one or more, respective output currents of the DA converter 13, to the driver load capacity value is always constant. Namely, the load of the drivers DRV0 to DRV9 is distributed, and the load of the drivers DRV0 to DRV9 to the drive current is the same for all bits. The responsiveness of all bits is the same, and the lower bits are significantly less loaded than in the comparison example, and thus the responsiveness is improved.

In this way, it is possible to provide the laser drive apparatus that supplies a current at the same response speed regardless of video data (or digital input code). As a result, the responsiveness of the laser drive apparatus can be improved as compared with the prior art. Namely, in the present embodiment, by configuring the response speed of the laser drive apparatus to be constant without depending on the brightness (video data), color matching can be facilitated and a clear image can be obtained. It is possible to support high resolution by increasing the responsiveness when the video data is small which is a bottleneck of the responsiveness.

Second Embodiment

Figure 5:
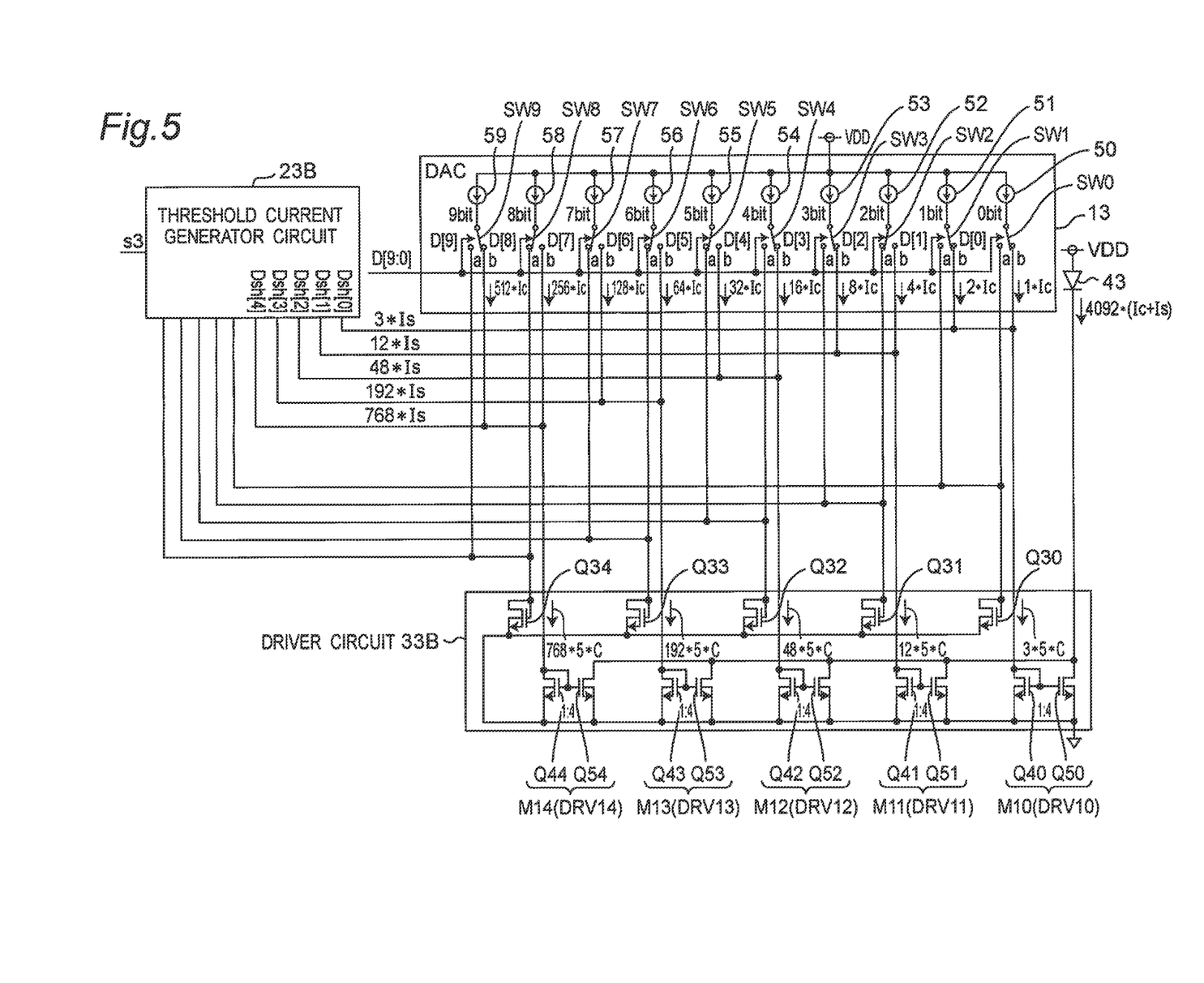
FIG. 5 is a circuit diagram of a configuration example of a threshold current generator circuit, a DA converter, and a driver circuit for a laser drive apparatus according to a second embodiment.

FIG. 5 is a circuit diagram of a configuration example of a threshold current generator circuit 23B, a DA converter 13, and a driver circuit 33B for a laser drive apparatus according to a second embodiment. The circuit of FIG. 5 differs from the circuit of FIG. 3 in the following points:

(1) the threshold current generator circuit 23B is provided in place of the threshold current generator circuit 23; and (2) the driver circuit 33B is provided in place of the driver circuit 33.

It is noted that the DA converter 13 has the same configuration as that of FIG. 3. The differences will be described below.

Referring to FIG. 5, the threshold current generator circuit 23B generates predetermined threshold currents Dsh [0] to Dsh [4] corresponding to each adjacent two (pair of) current sources (50, 51; 52, 53; 54, 55; 56, 57; and 58, 59; each pair of current sources configures a set of current sources) in response to the timing signal s3, and supplies the predetermined threshold currents Dsh [0] to Dsh [4] to the driver circuit 33B. In this case, the threshold currents Dsh [m]

TABLE 2

| | | 9 bits | 8 bits | 7 bits | 6 bits | 5 bits | 4 bits | 3 bits | 2 bits | 1 bit | 0 bits |
| --- | --- | --- | --- | --- | --- | --- | --- | --- | --- | --- | --- |
| Item | Total | DRV9 | DRV8 | DRV7 | DRV6 | DRV5 | DRV4 | DRV3 | DRV2 | DRV1 | DRV0 |
| Video data | 1023 | 512 | 256 | 126 | 64 | 32 | 16 | 8 | 4 | 2 | 1 |
| DAC output current | 512*I | 460.8*I | 230.4*I | 115.2*I | 57.6*I | 28.8*I | 14.4*I | 7.2*I | 3.6*I | 1.8*I | 0.9*I |
| Threshold current | 512*I | 51.2*I | 25.6*I | 12.8*I | 6.4*I | 3.2*I | 1.6*I | 0.8*I | 0.4*I | 0.2*I | 0.1*I |
| Driver mirror ratio | 1:4 | | | | | 1:4 | | | | | |
| Driver load capacity | 5115*C | 2560*C | 1280*C | 640*C | 320*C | 160*C | 80*C | 40*C | 20*C | 10*C | 5*C |
| Driver output current | 4092*I | 2048*I | 1024*I | 512*I | 256*I | 128*I | 64*I | 32*I | 16*I | 8*I | 4*I |
| Capacity:Current | 5:1 | 5:1 | 5:1 | 5:1 | 5:1 | 5:1 | 5:1 | 5:1 | 5:1 | 5:1 | 5:1 |

(m=0, 1, 2, . . . , 4) are supplied to the control-side MOS transistor Q (10+m) of the driver DRV (10+m) described later.

The driver circuit 33B is configured to include:

(1) a diode-connected MOS transistor Q (40+n) connected to each adjacent two (pair of) current sources (50, 51; 52, 53; 54, 55; 56, 57; and 58, 59) when each of the switches SWn (n=0, 1, 2, . . . , 9) is switched over to the contact "a" and not allowing the drive current to flow; and (2) a current mirror circuit M (10+m) of a driver DRVm (m=0, 1, 2, 3, 4) connected to each adjacent two (pair of) current sources (50, 51; 52, 53; 54, 55; 56, 57; and 58, 59) when each of the switches SWn (n=0, 1, 2, . . . , 9) is switched over to the contact "b" and allowing the drive current to flow.

In this case, the current mirror circuits M10 to M19 have a mirror ratio of 1:4, is configured to include control-side MOS transistors Q (40+m) and load-side MOS transistors Q (50+m) (m=0, 1, 2, 3, 4), and controls the MOS transistors (40+m) and (50+m) such that the drive current being in proportion to the control current flowing through the control-side MOS transistor Q (40+m) flows through the corresponding load-side MOS transistor Q (50+m).

Thus, in the circuit of FIG. 5, each of the drivers DRV10 to DRV14 is provided corresponding to each adjacent two (pair of) current sources (50, 51; 52, 53; 54, 55; 56, 57; and 58, 59), and the threshold current generator circuit 23B generates and outputs the different threshold currents Dsh [0] to Dsh [4] corresponding to the respective current sources 50 to 59 (namely, each bit of the digital input code).

The above circuit of FIG. 5 describes the threshold current generator circuit 23B, the DA converter 13, and the driver circuit 33B in relation to the light emission of the laser diode 43. The following components are configured in a manner similar to the circuit of FIG. 5:

(1) the threshold current generator circuit 21B (not shown), the DA converter 11, and the driver circuit 31B (not shown) in relation to the light emission of the laser diode 41; and (2) the threshold current generator circuit 22B (not shown), the DA converter 12, and driver circuit 32B (not shown) in relation to the light emission of the laser diode 42.

In the circuit of FIG. 5 configured as above, each bit of the DA converter 13 is weighted bit by bit so as to output the drive current corresponding to the digital input code of video data. The output currents Dsh [0] to Dsh [4] of the threshold current generator circuit 23B are divided such that the drive currents correspond to respective bits of the respective current sources 50 to 59 of the DA converter 13. In the divided drivers DRV10 to DRV14, the output currents of the threshold current generator circuit 23B and the drive currents of respective bits of the DA converter 13 are merged and coupled, for example, by two so as to reduce a load bias of each of the drivers. When the digital input code of the video data is inputted as the full code, all the drivers DRV10 to DRV14 operate, and the total load capacity is the same as that of the driver circuit 33 of the comparison example. In this case, the outputs of the drivers DRV10 to DRV14 are all bundled and combined. The current sources 50 to 59 of respective bits of the DA converter 13 output the drive currents according to the weighting. The drivers DRV10 to DRV14 for each adjacent two (pair of) current sources (50, 51; 52, 53; 54, 55; 56, 57; and 58, 59) of the DA converter 13 have different capacities, but the total load capacity of the driver circuit 33B is 1023*5*C.

Table 3 shows an example of the DAC output current for each video data in the laser drive apparatus according to the second embodiment, the output current of the threshold current generator circuit, the current mirror ratio of the driver, the driver load capacity, and the ratio of the driver load capacity and the DAC output current.

TABLE 3

|  |  | 9 bits | 8 bits | 7 bits | 6 bits | 5 bits | 4 bits | 3 bits | 2 bits | 1 bit | 0 bits |
|---|---|---|---|---|---|---|---|---|---|---|---|
| Item | Total | DRV14 | | DRV13 | | DRV12 | | DRV11 | | DRV10 | |
| Video data | 1023 | 512 | 256 | 126 | 64 | 32 | 16 | 8 | 4 | 2 | 1 |
| Dac output current | 921*I | 460.8*I | 230.4*I | 115.2*I | 57.6*I | 28.8*I | 14.4*I | 7.2*I | 3.6*I | 1.8*I | 0.9*I |
| Threshold current | 1023*I | 76.8*I | | 19.2*I | | 4.8*I | | 1.2*I | | 0.3*I | |
| Driver mirror ratio | 1:4 | | | | | 1:4 | | | | | |
| Driver load capacity | 5115*C | 3840*C | | 960*C | | 240*C | | 60*C | | 15*C | |
| Driver output current | 4092*I | 2150*I | 1229*I | 538*I | 307*I | 134*I | 77*I | 34*I | 19*I | 8*I | 5*I |
| Capacity:Current | 6:1 | 7:1 | 12.5:1 | 7:1 | 12.5:1 | 7:1 | 12.5:1 | 7:1 | 12.5:1 | 7:1 | 12.5:1 |

In this case, calculations are performed where Ic=0.9*I and Is=0.1*I.

Each of the output currents Dsh [0] to Dsh [4] of the threshold current generator circuit 23B when each value of the digital input code of the video data is one or more is always constant. In addition, the DAC output current and the driver load capacity value increase or decrease in conjunction with each RGB value of the video data (or digital input code), but the load capacity is distributed because the load capacity is divided into the four drivers DRV10 to DRV14. The ratio of the capacity to the DAC is 5 to 1 at the minimum and 12.5 to 1 at the maximum, and thus the variation in the responsiveness of the laser drive apparatus for the single driver is greatly improved. In this case, the respective output currents from the current sources 50 to 59 are weighted in accordance with the bit of the digital input code, and are configured such that the ratio of each output current from each current source 50 to 59 to the load capacity of each of the drivers DRV10 to DRV14 having each of the current mirror circuits M10 to M14 is the same for all the sets of current sources corresponding to each of the current sources 50 to 59.

Namely, in the present embodiment, by configuring the response speed of the laser drive apparatus to be constant without depending on the brightness (video data), color matching can be facilitated and a clear image can be obtained. It is possible to support high resolution by increasing the responsiveness when the video data is small, which is a bottleneck of the responsiveness.

Modified Embodiment of Second Embodiment

In the circuit of FIG. 5 according to the second embodiment, each of the drivers DRV10 to DRV14 is provided corresponding to every two (a pair of) adjacent current sources (50, 51; 52, 53; 54, 55; 56, 57; and 58, 59), and the threshold current generator circuit 23B generates and outputs the different threshold currents Dsh [0] to Dsh [4] corresponding to each of the current sources 50 to 59 (namely, each bit of the digital input code). However, each of the drivers of the driver circuit 33B may be provided corresponding to every three or more (a set of) adjacent current sources. In this case, the threshold current generator circuit 23B generates and outputs different threshold currents corresponding to each set of the current sources.

Differences from Patent Document 1

The laser drive apparatus according to Patent Document 1 drives a laser diode by a PWM modulation system, which is different from the power modulation system.

Patent Document 1 discloses the laser drive apparatus using an auxiliary current in order to reduce emission delay time of a semiconductor laser, and a current Iop for causing the laser to emit light is generated with a light emitting current Idac as the output of the DA converter and the auxiliary current Ish. In order to reduce the area of the DA converter, the output of the DA converter is turned back by the current mirror. However, when the conventional configuration is applied to the power modulation system, the problem that the charging time to the load capacity of the driver changes depending on the video data has not been solved.

On the other hand, in the present embodiment, the load of the driver is distributed, and thus by configuring the response speed of the laser drive apparatus to be constant without depending on the brightness (video data), color matching can be facilitated and a clear image can be obtained. In addition, it is possible to support high resolution by increasing the responsiveness in the case of small video data which is a bottleneck of the responsiveness.

INDUSTRIAL APPLICABILITY

As mentioned in detail above, according to the present invention, the load of the driver is distributed and, thus, by configuring the response speed of the laser drive apparatus to be constant without depending on the brightness (video data), color matching can be facilitated and a clear image can be obtained. In addition, it is possible to support high resolution by increasing the responsiveness in the case of small video data which is a bottleneck of the responsiveness.

The invention claimed is:

1. A laser drive apparatus comprising:
   a digital to analog converter including a plurality of current sources of a number corresponding to a bit number of a digital input code and a plurality of switches of a number corresponding to the number of bits, the plurality of switches being connected to the plurality of current sources and selectively switching over presence or absence of output of a control current from each of the plurality of current sources, the digital to analog converter outputting control currents corresponding to the digital input code as output respective currents from the plurality of switches; and
   a driver circuit including a plurality of current mirror circuits that generate a drive current corresponding to each of the output currents based on each of the output currents to drive a laser diode,
   wherein the driver circuit that includes the plurality of current mirror circuits is connected to each of the plurality of current sources via each of the plurality of switches, and generates a drive current corresponding to each of the output currents from each of the plurality of current sources to drive the laser diode,
   wherein the digital input code is converted from input video data, and provided to the digital-to-analog converter that generates RGB drive currents for a laser scanning type image display apparatus driven by the laser drive apparatus,
   wherein the output currents from the plurality of current sources are weighted in accordance with bits of the digital input code,
   wherein a ratio of each of the output currents from each of the plurality of current sources to a load capacity of a driver having each of the current mirror circuits is identical for all the bits corresponding to each of the plurality of current sources, and
   wherein the plurality of current mirror circuits is configured to distribute load capacity of the driver circuit.

2. The laser drive apparatus as claimed in claim 1, further comprising a threshold current generator circuit that generates a threshold current for a step-up at time of light emission for each of the plurality of current mirror circuits in response to the digital input code and each of the output currents from each of the plurality of current sources, and that adds the threshold current to the drive current.

3. A laser drive apparatus comprising:
   a digital to analog converter including a plurality of current sources of a number corresponding to a bit number of a digital input code and a plurality of switches of a number corresponding to the number of bits, the plurality of switches being connected to the plurality of current sources and selectively switching over presence or absence of output of a control current from each of the plurality of current sources, the digital to analog converter outputting control currents corresponding to the digital input code as output respective currents from the plurality of switches; and
   a driver circuit including a plurality of current mirror circuits that generate a drive current corresponding to each of the output currents based on each of the output currents to drive a laser diode,
   wherein in the driver circuit that includes the plurality of current mirror circuits, the plurality of current sources is divided into a plurality of current source sets, the plurality of current mirror circuits being connected to the plurality of current source sets via the plurality of switches, and generating a drive current corresponding to each of the output currents from the plurality of current source sets to drive the laser diode,
   wherein the digital input code is converted from input video data, and provided to the digital-to-analog converter that generates RGB drive currents for a laser scanning type image display apparatus driven by the laser drive apparatus,
   wherein the output currents from the plurality of current sources are weighted in accordance with bits of the digital input code,
   wherein a ratio of each of the output currents from each of the plurality of current sources to a load capacity of a driver having each of the current mirror circuits is identical for all the plurality of current source sets corresponding to each of the plurality of current sources, and
   wherein the plurality of current mirror circuits is configured to distribute load capacity of the driver circuit.

4. The laser drive apparatus as claimed in claim 3, further comprising a threshold current generator circuit that generates a threshold current for a step-up at time of light emission for each of the plurality of current mirror circuits in response to the digital input code and each of the output currents from each of the plurality of current sources, and that adds the threshold current to the drive current.

5. An image display apparatus comprising a laser drive apparatus, the laser drive apparatus comprising:
- a digital to analog converter including a plurality of current sources of a number corresponding to a bit number of a digital input code and a plurality of switches of a number corresponding to the number of bits, the plurality of switches being connected to the plurality of current sources and selectively switching over presence or absence of output of a control current from each of the plurality of current sources, the digital to analog converter outputting control currents corresponding to the digital input code as output respective currents from the plurality of switches; and
- a driver circuit including a plurality of current mirror circuits that generate a drive current corresponding to each of the output currents based on each of the output currents to drive a laser diode,
- wherein the driver circuit that includes a plurality of current mirror circuits is connected to each of the plurality of current sources via each of the plurality of switches, and generates a drive current corresponding to each of the output currents from each of the plurality of current sources to drive the laser diode,
- wherein the digital input code is converted from input video data, and provided to the digital-to-analog converter that generates RGB drive currents for a laser scanning type image display apparatus driven by the laser drive apparatus,
- wherein the output currents from the plurality of current sources are weighted in accordance with bits of the digital input code,
- wherein a ratio of each of the output currents from each of the plurality of current sources to a load capacity of a driver having each of the current mirror circuits is identical for all the bits corresponding to each of the plurality of current sources, and
- wherein the plurality of current mirror circuits is configured to distribute load capacity of the driver circuit.

6. An image display apparatus comprising a laser drive apparatus, the laser drive apparatus comprising:
- a digital to analog converter including a plurality of current sources of a number corresponding to a bit number of a digital input code and a plurality of switches of a number corresponding to the number of bits, the plurality of switches being connected to the plurality of current sources and selectively switching over presence or absence of output of a control current from each of the plurality of current sources, the digital to analog converter outputting control currents corresponding to the digital input code as output respective currents from the plurality of switches; and
- a driver circuit including a plurality of current mirror circuits that generate a drive current corresponding to each of the output currents based on each of the output currents to drive a laser diode,
- wherein in the driver circuit that includes the plurality of current mirror circuits, the plurality of current sources is divided into a plurality of current source sets, the plurality of current mirror circuits being connected to the plurality of current source sets via the plurality of switches, and generating a drive current corresponding to each of the output currents from the plurality of current source sets to drive the laser diode,
- wherein the digital input code is converted from input video data, and provided to the digital-to-analog converter that generates RGB drive currents for a laser scanning type image display apparatus driven by the laser drive apparatus,
- wherein the output currents from the plurality of current sources are weighted in accordance with bits of the digital input code,
- wherein a ratio of each of the output currents from each of the plurality of current sources to a load capacity of a driver having each of the current mirror circuits is identical for all the plurality of current source sets corresponding to each of the plurality of current sources, and
- wherein the plurality of current mirror circuits is configured to distribute load capacity of the driver circuit.

* * * * *